(12) United States Patent
Jadus et al.

(10) Patent No.: US 11,150,300 B2
(45) Date of Patent: Oct. 19, 2021

(54) ADAPTIVE BLANKING OF OVER CURRENT FAULT DETECTION CIRCUITS IN POWER CONVERSION GATE DRIVERS

(71) Applicant: Analog Devices International Unlimited Company, Limerick (IE)

(72) Inventors: Brian K. Jadus, Williston, VT (US); Steven John Tanghe, Essex Junction, VT (US); Deepak Gunasekaran, Longmont, CO (US); Michael Collins, Firestone, CO (US)

(73) Assignee: Analog Devices International Unlimited Company, Limerick (IE)

( * ) Notice: Subject to any disclaimer, the term of this patent is extended or adjusted under 35 U.S.C. 154(b) by 95 days.

(21) Appl. No.: 16/715,961

(22) Filed: Dec. 16, 2019

(65) Prior Publication Data
US 2021/0181254 A1    Jun. 17, 2021

(51) Int. Cl.
| | | |
|---|---|---|
| *G01R 31/327* | (2006.01) | |
| *G01R 31/26* | (2020.01) | |
| *G01R 19/165* | (2006.01) | |
| *H02H 7/12* | (2006.01) | |

(52) U.S. Cl.
CPC ... *G01R 31/3275* (2013.01); *G01R 19/16519* (2013.01); *G01R 31/2617* (2013.01); *G01R 31/2621* (2013.01); *H02H 7/1203* (2013.01)

(58) Field of Classification Search
CPC ............ G01R 31/2617; G01R 31/2621; G01R 31/2637; G01R 31/2831; G01R 31/3275; G01R 31/343; G01R 31/26; G01R 19/16519; G01R 19/16523; G01R 19/16528; G01R 19/16547; G01R 19/003
See application file for complete search history.

(56) References Cited

U.S. PATENT DOCUMENTS

| | | |
|---|---|---|
| 5,438,503 A | 8/1995 | Stanley |
| 5,903,422 A | 5/1999 | Hosokawa |
| 8,531,851 B2 | 9/2013 | Chen |
| 9,484,799 B2 | 11/2016 | Zhang et al. |
| 9,520,879 B2 | 12/2016 | Zhang et al. |

(Continued)

FOREIGN PATENT DOCUMENTS

| | | |
|---|---|---|
| EP | 1891735 B1 | 4/2013 |
| JP | 2006060971 A | 3/2006 |

(Continued)

OTHER PUBLICATIONS

"3888A: Quad High-Side and Octal Low-Side Switch for Automotive", Freescale Semiconductor, Inc., (2007), 40 pgs.

(Continued)

*Primary Examiner* — Thang X Le
(74) *Attorney, Agent, or Firm* — Schwegman Lundberg & Woessner, P.A.

(57) ABSTRACT

An electronic circuit comprises a power switch circuit and a fault detection circuit. The power switch circuit includes a transistor. The fault detection circuit includes a first comparator circuit configured to compare a monitored voltage of the transistor to a detection threshold voltage and produce an indication of a circuit fault according to the comparing, and a delay circuit configured to delay the comparing by the first comparator circuit according to slew rate of the monitored voltage.

23 Claims, 6 Drawing Sheets

(56) References Cited

U.S. PATENT DOCUMENTS

| | | |
|---|---|---|
| 9,733,296 B2 | 8/2017 | Baik et al. |
| 9,948,187 B2 | 4/2018 | Gong et al. |
| 10,222,422 B2 | 3/2019 | Zhang et al. |
| 10,312,898 B2 | 6/2019 | Moctezuma et al. |
| 2012/0049829 A1 | 3/2012 | Murakami |
| 2016/0329808 A1 | 11/2016 | Han |
| 2019/0267983 A1* | 8/2019 | Llling ................ H03K 17/0822 |
| 2020/0014192 A1* | 1/2020 | Ramachandran ........ H02H 3/38 |
| 2020/0366079 A1* | 11/2020 | Telefus .................. G01R 31/52 |

FOREIGN PATENT DOCUMENTS

| | | |
|---|---|---|
| JP | 4504222 B2 | 4/2010 |
| KR | 20110037367 A | 4/2011 |

OTHER PUBLICATIONS

Barlow, Matthew W., "Design and Test of a Gate Driver with Variable Drive and Self-Test Capability Implemented in a Silicon Carbide CMOS Process", Dissertation in Electrical Engineering at the University of Arkansas, Fayetteville, (May 2017), 198 pgs.

\* cited by examiner

ADAPTIVE BLANKING OF OVER CURRENT FAULT DETECTION CIRCUITS IN POWER CONVERSION GATE DRIVERS

FIELD OF THE DISCLOSURE

This document relates to power conversion circuits that provide an alternating current or a direct current regulated supply from an input voltage, and in particular to fault detection in power conversion circuits.

BACKGROUND

Electronic systems can include devices that require a regulated power source. Switching power converter circuits can be used to provide a regulated voltage to a load or generate AC waveforms to a load. Switching power converter circuits can include semiconductor switches to control delivery of energy to a circuit element such as a motor, an inductor, or a transformer. However, excessive power dissipation in the semiconductor switches can damage the switches. Fast detection of overcurrent conditions can avoid damaging the switch, but conventional approaches for detection can be too slow to prevent damage to the switches.

SUMMARY OF THE DISCLOSURE

This document relates generally to switching power converters and methods of their operation. In some aspects, an electronic circuit comprises a power switch circuit and a fault detection circuit. The power switch circuit includes a transistor. The fault detection circuit includes a first comparator circuit configured to compare a monitored voltage of the transistor to a detection threshold voltage and produce an indication of a circuit fault according to the comparing, and a delay circuit configured to delay the comparing by the first comparator circuit according to slew rate of the monitored voltage.

In some aspects, a method of monitoring a power switch circuit for a fault condition includes applying a turn on signal to a transistor of the power switch, comparing a monitored voltage of the transistor to a detection threshold voltage, delaying the comparing for a time delay, wherein the time delay is determined using slew rate of the monitored voltage of the transistor, and indicating a circuit fault according to the comparing of the monitored voltage of the transistor to the detection threshold voltage after the time delay.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Power converter circuits may be used to provide a regulated voltage output for an electronic system. Some power converter circuits are switching power converter circuits that convert the input voltage to the regulated output voltage. The regulated voltage conversion can provide a regulated output voltage that is higher than the input voltage of the regulator, lower than the input voltage, or inverted from the input voltage. The regulation is typically achieved by recurrently charging an energy storage element, such as an inductor or transformer, from an energy source and then discharging the stored energy to drive a load. The charging and discharging can be accomplished using power switches that include transistors. The power switches can include power transistors that are rated for high current. However, excessive power dissipation in the power transistors can still damage the transistors leading to failure of the switching power converter circuit.

Additionally, power conversion circuits may be used to provide an alternating voltage output waveform for an electrical system. Some power conversion circuits are switching power converter circuits that convert the input voltage to the alternating output voltage waveform. The waveform generation is typically achieved by recurrently charging a load containing an inductive energy storage component, such as a motor or transformer. The charging and discharging can be accomplished using power switches that include transistors. The power switches can include power transistors that are rated for high current. However, excessive power dissipation in the power transistors can still damage the transistors leading to failure of the switching power converter circuit.

One approach to detect an excessive power condition of a switching transistor is to monitor the voltage across the switch (e.g., the drain-to-source voltage ($V_{DS}$) of a field effect transistor (FET) of the switch). For power converter circuits it is desired for the switching transistors to be in the linear operating region. The saturation region of the switching transistor is an undesired high current, high power dissipation condition. The voltage across the switch is monitored to detect when the transistor is in the saturation region. This approach can be referred to as the detect-saturation or de-sat method.

A problem with this technique of fault detection is that when the switch is turned on, the monitored voltage of the power switch collapses from its OFF voltage (perhaps hundreds or thousands of volts) to the ON voltage (perhaps volts or less). Monitoring for a fault immediately when turning the switch on can lead to false fault detections. To avoid false detections, the fault monitoring can be delayed for a fixed amount of time to allow the monitored voltage to fall. After the fixed delay time (or blanking time), the monitored voltage is checked to make sure that the transistor is not in the saturation region.

However, using a fixed delay time is inflexible to system implementations and switch characteristics. A better approach is to use a dynamic delay that can adapt to variations of the power converter.

Figure 1:
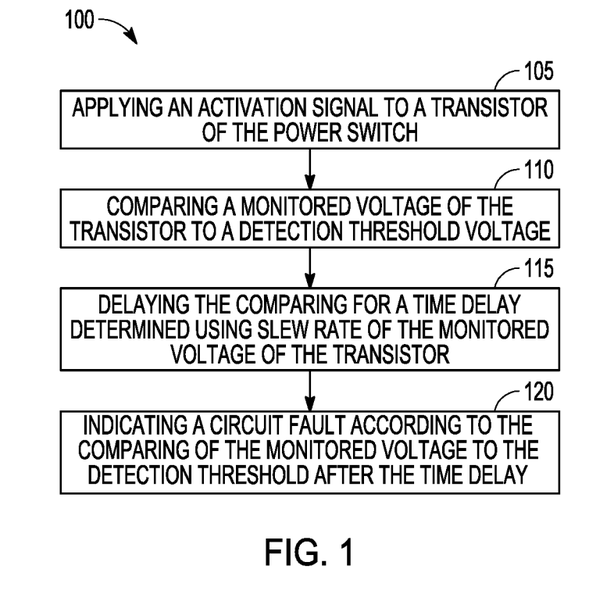
FIG. 1 is a flow diagram of a method of monitoring a power switch circuit for a fault condition.

FIG. 1 is a flow diagram of a method 100 of monitoring a power switch circuit for a fault condition. At 105, an activation signal or turn ON signal is applied to a transistor of the power switch circuit. At 110, in response to the activation signal, a voltage of the transistor is monitored and compared to a detection threshold voltage. In some aspects, the transistor is a field effect transistor (FET) and the voltage at the drain to the source of the transistor ($V_{DS}$) is monitored.

At 115, the comparing is delayed in response to activation of the transistor. The time duration of the delay is determined using slew rate of the monitored voltage of the transistor. In FET example, the time delay is determined according to $dV_D/dt$, or $\Delta V_D/\Delta t$. After the time delay, the monitored voltage of the transistor is compared to the detection threshold voltage. At 120, a circuit fault is indicated according to the comparing, such as when the comparing indicates that the transistor is not in its safe operating area (SOA).

Figure 2:
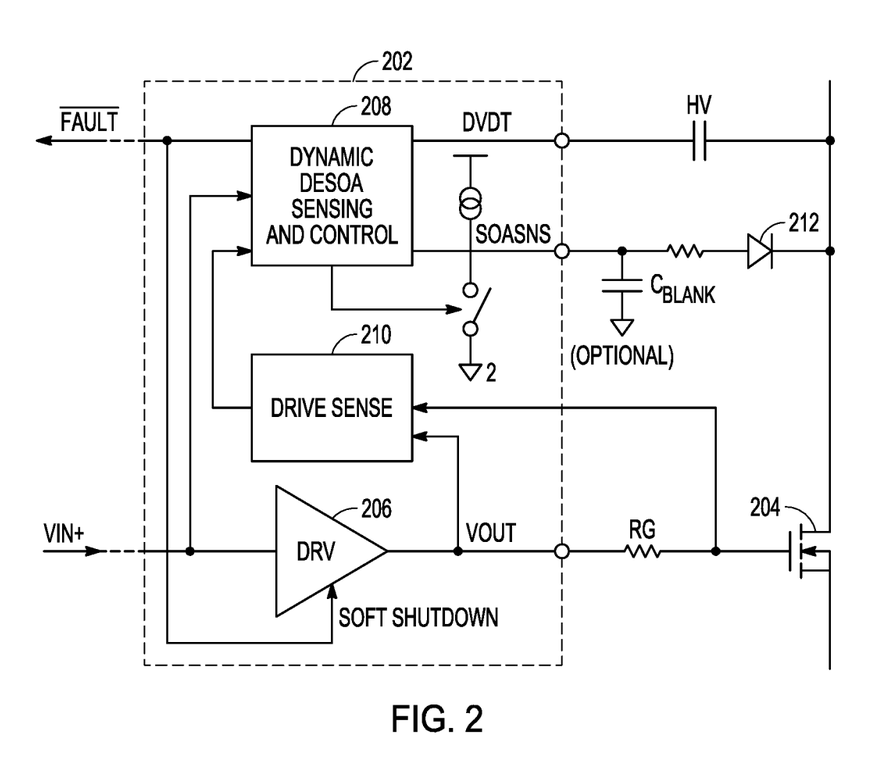
FIG. 2 shows portions of an example of circuitry for driving and fault detection for a power switch circuit.

FIG. 2 shows portions of an example of circuitry for driving and fault detection for a power switch circuit. The power switch circuit can be included in a power converter circuit or any electronic circuit that uses a power switch. The power switch circuit includes transistor 204. In certain aspects, transistor 204 is a power transistor that is rated for high current. FIG. 2 shows a drive circuit 206 to drive the transistor 204 and a fault detection circuit. The fault detection circuit includes dynamic sensing and control circuitry 208 and drive sense circuitry 210 that monitors voltage of the transistor 204. The drive circuit 206 and the fault detection circuit may be included on an integrated circuit 202 (IC) and the transistor 204 may be external to the IC. A blocking diode 212 may be included in the monitoring circuitry.

Figure 3A:
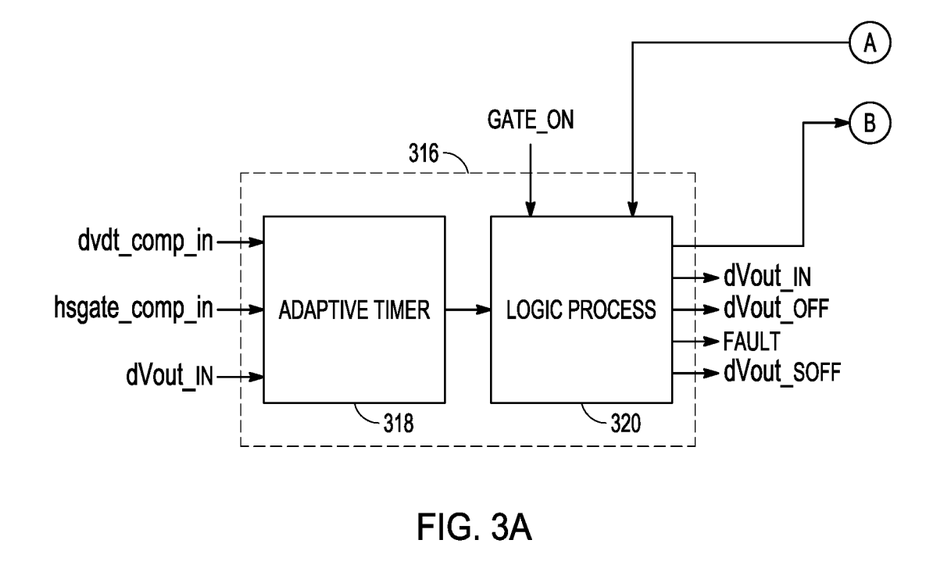
FIGS. 3A and 3B show example circuits for dynamic sensing and control of a power switch circuit.
Figure 3B:
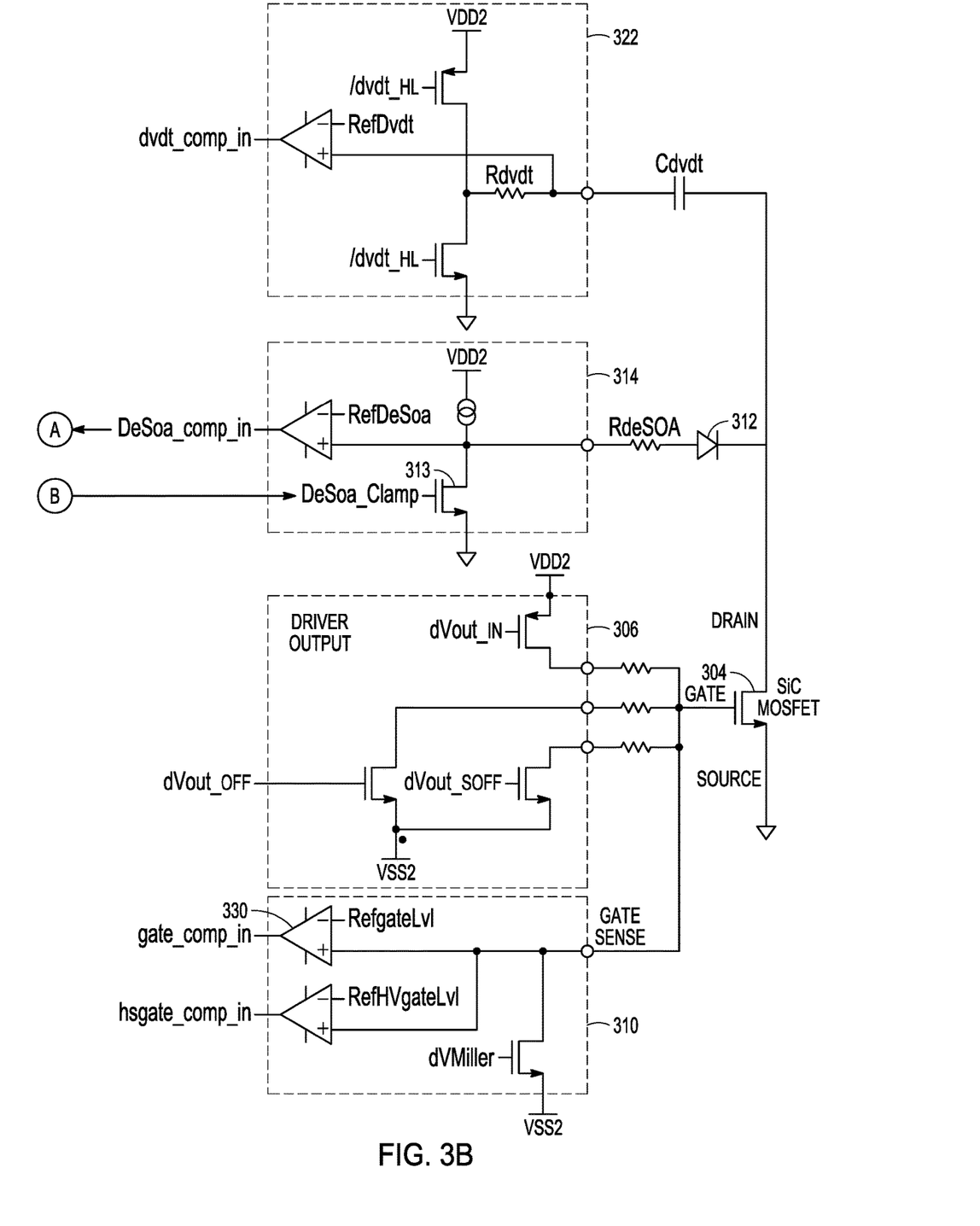

FIGS. 3A and 3B are circuit diagrams with example circuits that can be included in the dynamic sensing and control circuitry and the drive sense circuitry of FIG. 2. In FIG. 3B, transistor 304 is transistor 204 in FIG. 2. In the example of FIG. 3B, the transistor is a field effect transistor (FET). The transistor 304 may be a silicon field effect transistor (Si FET), a silicon carbide FET (SiC FET), or a gallium nitride field effect transistor (GaN FET). In variations, the transistor 304 can be an insulated gate bipolar transistor (IGBT), or a bipolar junction transistor (BJT).

The dynamic sensing and control circuitry includes a comparator circuit 314 to monitor a voltage of the transistor 304. If transistor 305 is an FET, the comparator circuit 314 monitors the drain voltage ($V_D$) of the FET relative to the source voltage ($V_S$). If transistor 304 is a BJT, the comparator circuit monitors the collector voltage ($V_C$) of the BJT relative to the emitter voltage ($V_E$). The comparator circuit can be used to monitor that the transistor operates in a safe operating area (SOA). Diode 312 in FIG. 3B corresponds to blocking diode 212 in FIG. 2.

The dynamic sensing and control circuitry also includes a delay circuit 316 shown in FIG. 3A. The delay circuit 316 delays the comparing by the comparator circuit according to the slew rate of the monitored voltage. The delay circuit 316 can include a timer circuit 318 to time the delay and logic circuitry 320 that enables the comparator after the delay time expires. In certain aspects, the comparator circuit 314 includes a pull-down transistor 313, and the logic circuitry 320 turns on the transistor (via the DeSOA_Clamp signal) to pull down an input of the comparator circuit to clamp the output of the comparator circuit to a non-monitoring state.

Figure 4:
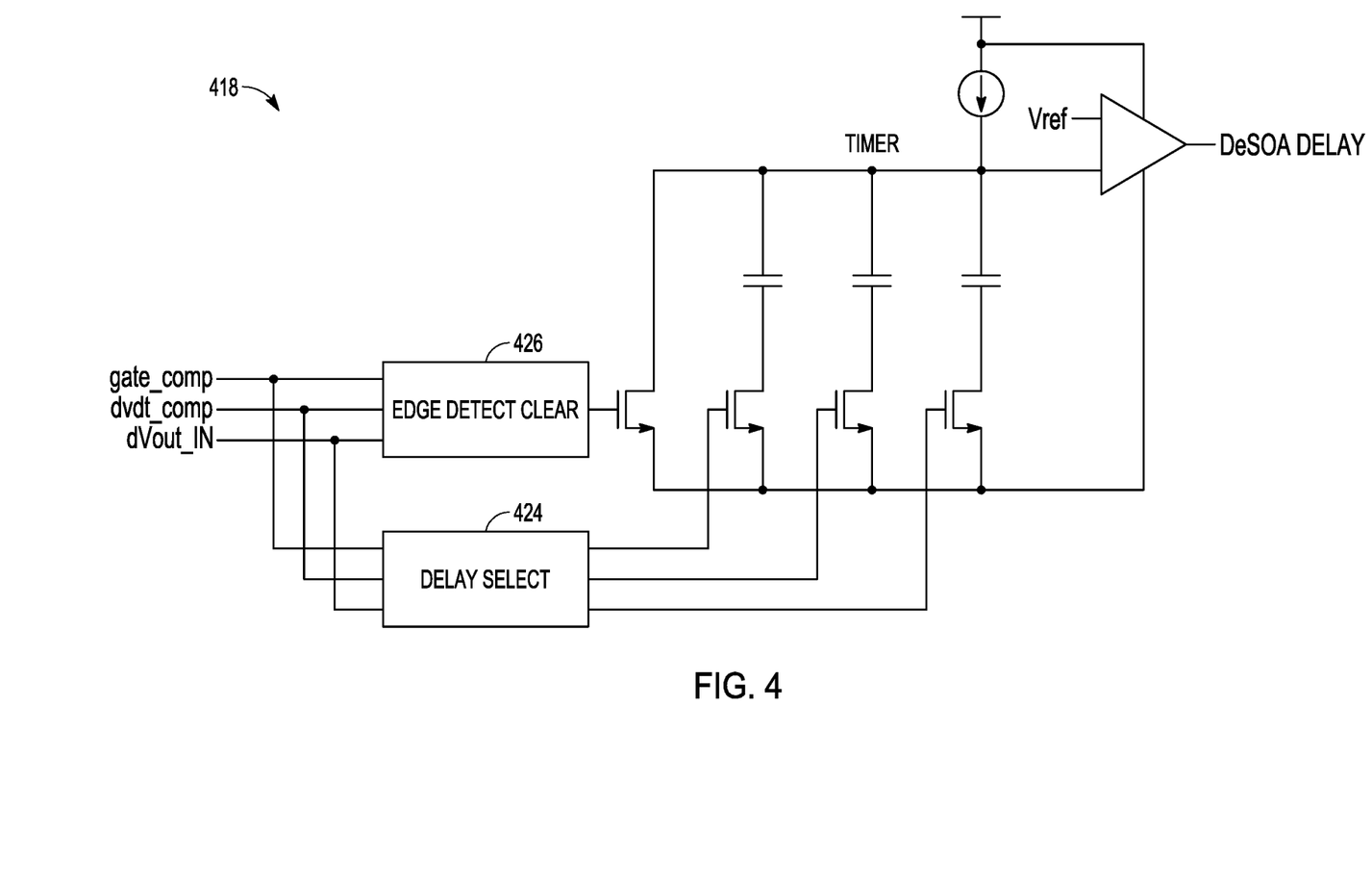
FIG. 4 is a circuit diagram of an example of an adaptive timer circuit.

FIG. 4 is a circuit diagram of an example of an adaptive timer circuit. The delay is produced by charging one or more capacitors. When the voltage at the node labeled Timer exceeds a reference voltage or detection voltage, an output of the time circuit 418 is provided to the logic circuitry that enables the monitoring of the drain voltage by comparator circuit 314. The timer circuit 418 includes delay logic 424 to change the amount of delay based on events, and edge detect logic 426 to reset the time delay. In variations, the timer circuit 418 can include logic circuits that provide an output after a specified count instead of after a specified voltage is reached.

Returning to FIG. 3B, the dynamic sensing and control circuitry can include a slew rate sensing circuit 322. The output of the slew rate sensing circuit 322 can be used to reset the timer circuit 318 based on the slew rate. The stewing may indicate that activation of the transistor 304 is progressing and the comparison of the drain voltage can be delayed. The edge detect logic of the adaptive timer circuit is coupled to the output of the slew rate sensing circuit 322. The slew rate sensing circuit 322 includes a comparator that detects when the drain voltage slew rate decreases to a threshold reference voltage. When the comparator changes due to stewing of the drain voltage, the edge from the state change resets the timer circuit 318. This causes the time delay to be adaptive based on the slew rate of the monitored voltage of the transistor.

Figure 5:
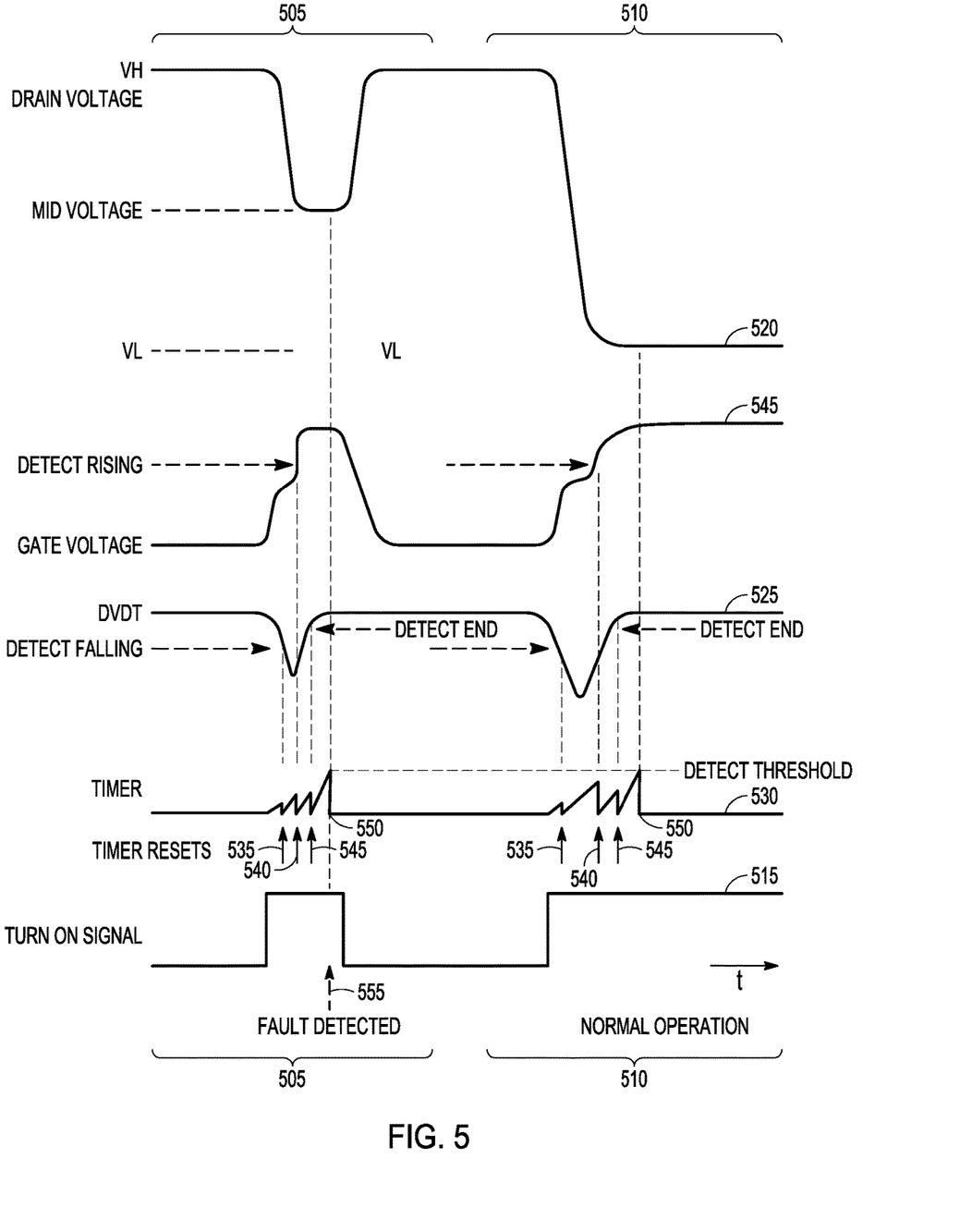
FIG. 5 shows example waveforms associated with operation of the circuit of FIGS. 3A and 3B.

FIG. 5 shows example waveforms associated with operation of the circuits of FIGS. 3A and 3B. The waveforms represent voltage versus time for the circuits during a startup fault 505 and during a normal startup 510. In the waveforms, it is assumed that the transistor 304 of FIG. 3B is a SiC FET. The bottom waveform 515 is the Turn ON signal applied to the gate of the transistor 304, and the top waveform 520 is the drain voltage of the transistor 304. In response to the activation of Turn ON signal, the drain voltage will fall. In the top waveform 520, the drain voltage is shown falling from a high level toward a low level VL. In the case of a fault, the drain voltage will not fall or only partially fall.

Waveform 525 represents the slew rate (DVDT) of the drain voltage of the transistor 304, and waveform 530 represents the circuit node labeled Timer in FIG. 4. The tinier circuit begins timing at activation of the Turn ON signal. The Timer waveform shows the node Timer rising slowly after the leading edge of Timer ON. The DVDT waveform falls below the detection voltage of the slew rate sensing circuit 322 to indicate that the drain voltage is falling. The timer circuit is reset by the detected stewing as shown by the zeroing of the Timer waveform at 535. If the drain voltage does not fall, the timer is not reset, and the monitoring of the drain voltage is eventually enabled. Because the drain voltage does not fall, a fault will be declared based on the level of the drain voltage.

Returning to FIG. 2, so far the monitoring of the drain voltage of transistor 204 by the dynamic sensing and control circuitry 208 has been described. The drive sense circuitry 210 of the fault detection circuit monitors the gate voltage of the transistor 204. (If the transistor is a bipolar transistor, the drive sense circuitry 210 monitors the base voltage of the transistor 204.) Under normal turn ON conditions of the transistor 204, the gate voltage will increase and the drain voltage falls. The gate voltage will reach a peak near the same time as the drain voltage stops falling. The gate voltage can be monitored to determine if the turn ON of the transistor 204 is normal.

Returning to FIG. 3B, an example of a drive circuit 306 and an example of drive sense circuitry 310 are shown. The drive sense circuitry 310 includes one or more comparators 330 to monitor the gate voltage. When the gate voltage rises to an activation level, or activation voltage threshold, a change in state of a comparator provides an edge to the timer circuit 318 which resets the timer circuit 318 of FIG. 3A. In FIG. 5, waveform 545 represents the Gate Voltage. The Timer waveform is shown reset by the timer circuit 318 at 540 when the Gate Voltage waveform rises above the activation level.

As explained previously herein, the amount of delay provided by the timer circuit can be changed based on events sensed during the start up. As shown in the Timer waveform of FIG. 5, after the timer circuit is reset by the slew rate sensing circuit 322 at 535, the Timer waveform starts rising with a steeper slope than the slope after the initial timing started from the Turn ON signal. The steeper slope corresponds to a shorter delay because of the faster rise time. A lower slope corresponds to a longer delay because of the slower rise time. Thus, a shorter time delay is started after the detected falling of the drain voltage to monitor the rising of the gate voltage.

When the gate voltage is high and the transistor 304 is ON, the drain voltage starts to settle, the slew rate will start to change polarity and, as shown in FIG. 5, the DVDT waveform starts to increase. The slew rate sensing circuit 322 may detect when the DVDT waveform increases above a detection value, or when the drain voltage stops decreasing. The comparator of the slew rate detection circuit 322 may have hysteresis to detect the falling then rising slew rate, or the slew rate detection circuit 322 may have a second comparator to detect the increase in the slew rate or settling of the drain voltage. The Timer waveform is shown reset by the timer circuit 318 at 545 when the DVDT waveform rises above the detection value.

After the settling of the drain voltage, the timer circuit is not reset by detected events and the timer circuit eventually times out at 550 in the Timer waveform of FIG. 5. The monitoring of the drain voltage by comparator circuit 314 is enabled. In the normal startup 510 scenario of FIG. 5, the drain voltage has fallen to a level (VL) that indicated normal startup. In the startup fault 505 scenario, the drain voltage has fallen to a mid-voltage level. The comparator circuit 314 indicates that the drain voltage does not correspond to a safe operating area and a fault is declared at 555. The dynamic sensing and control circuitry disables the power switch circuit in response to the indication of the circuit fault and deactivates the Turn ON signal to turn OFF the transistor 304.

In the startup fault 505 scenario shown in the example of FIG. 5, the timer circuit 318 of FIG. 3A is reset multiple times. If the timer circuit is not reset, the Fault is declared sooner than in the example scenario. For example, if the drain voltage does not fall at all after the turn ON signal is applied, the timer circuit 318 is not reset by the slew rate sensing circuit 312 and the timer circuit 318 times out sooner than if the timer circuit is reset. After a normal startup and the power switch is under load, the monitoring by comparator circuit 314 will be enabled and not delayed.

Figure 6:
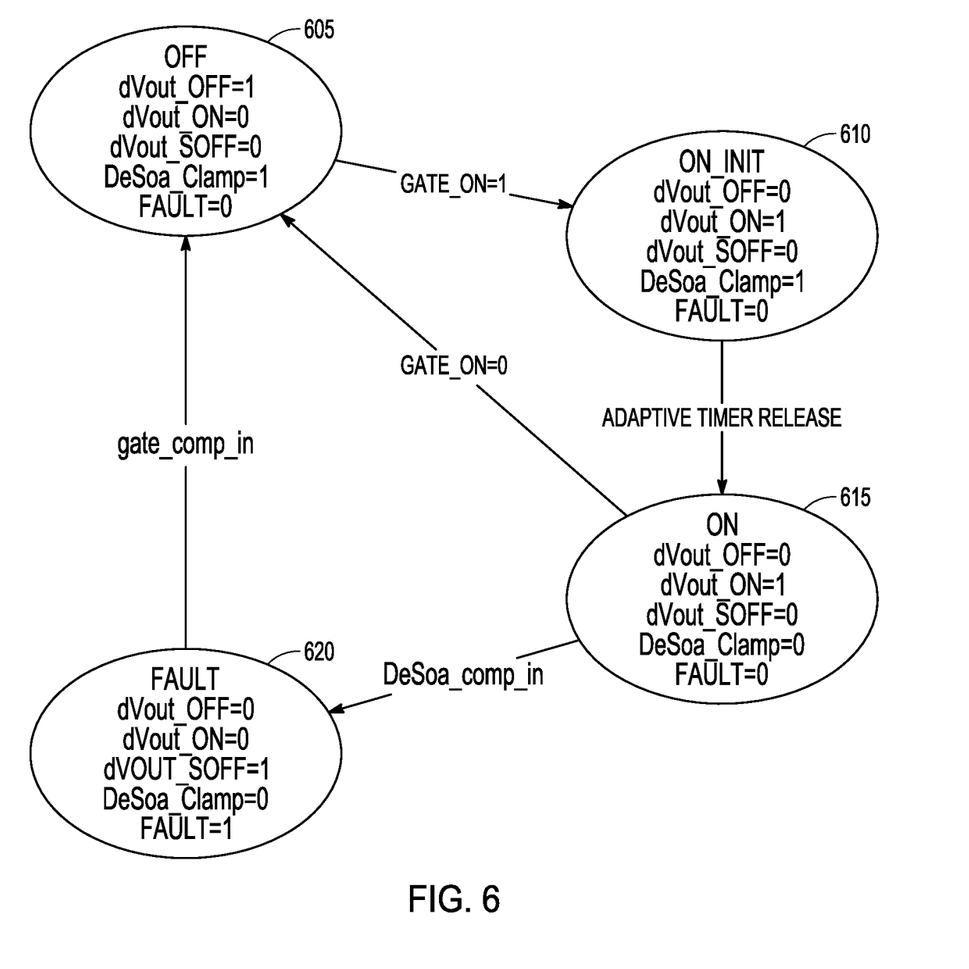
FIG. 6 is a state diagram of operation of the logic circuitry of FIG. 3A.

FIG. 6 is a state diagram of operation of the logic circuitry 320 of FIG. 3A. In the OFF State 605, the turn ON signal for the transistor that is received by the logic circuitry 320 GATE_ON is inactive or "0." The signal (dVout_OFF) provided by the logic circuitry to the drive circuit 306 to hold the transistor OH is active or "1," the signal (dVout_ON) provided by the logic circuitry to the drive circuit 306 to turn the transistor ON is 0, and the signal provided by the logic circuitry to the drive circuit 306 to turn the transistor OFF in the event of a fault (dVout_SOFF) is 0, The signal to clamp the comparator circuit 314 (DeSOA_Clamp) is 1, and the signal to indicate a fault (FAULT) is 0.

In response to activation of the signal to turn ON the transistor (Gate_ON changes to 1), the logic circuitry 320 transitions to an Initial ON State 610 (ON_INIT). Signal dVout_OFF changes to 0, and dVout_ON changes to 1. Signals dVout_SOFF and DeSOA_Clamp remain at 0 and 1 respectively.

The logic circuitry 320 transitions to an ON State 615 after the adaptive delay or adaptive blanking time expires (Adaptive Timer Release), and the clamp on the comparator circuit 314 is released (DeSOA_Clamp changes to 0). The logic circuitry 320 may remain in the ON State 615 until the signal to turn ON the transistor is deactivated (Gate_ON changes to 0) to return the logic circuitry 32s to the OFF State 605.

If the signal received from the comparator circuit 314 (DeSOA_comp_in) changes to indicate a fault based on the monitored voltage (e.g., the drain voltage), the logic circuitry 320 transitions to a FAULT State 620. The signal FAULT changes to 1, and dVout_SOFF changes to 1 to turn off the transistor 304 and disable the output of the power switch circuit. The logic circuitry 320 remains in the FAULT State 620 until the gate comparator 330 of the drive sense circuitry (gate_comp_in) indicates that the output is disabled, which returns the logic circuitry 620 to the OFF State 605.

The several examples of systems, devices, and method described provide an adaptive response time in the event of a circuit fault. The response time changes based on changes detected in the operation of the system. This can allow for a faster response time for transistors more susceptible to overcurrent conditions such as SiC FETs.

ADDITIONAL DESCRIPTION AND ASPECTS

Aspect 1 can include subject matter (such as an electronic circuit) comprising a power switch circuit including a transistor, and a fault detection circuit. The fault detection circuit includes a first comparator circuit configured to compare a monitored voltage of the transistor to a detection threshold voltage and produce an indication of a circuit fault according to the comparing, and a delay circuit configured to delay the comparing by the first comparator circuit according to slew rate of the monitored voltage.

In Aspect 2, the subject flatter of Aspect 1 optionally includes a delay circuit including a timer circuit configured to enable a time delay in response to activation of the transistor; and a slew rate sensing circuit configured to reset the timer circuit according to the slew rate of the monitored voltage.

In Aspect 3, the subject matter of Aspect 2 optionally includes a slew rate sensing circuit configured to reset the timer circuit when detecting that the monitored voltage of the transistor is decreasing.

In Aspect 4, the subject matter of one or both of Aspects 2 and 3 optionally includes the first comparator circuit configured to monitor a drain voltage of the transistor.

In Aspect 5, the subject matter of Aspect 4 optionally includes a fault detection circuit including a second comparator circuit configured to compare a gate voltage of the transistor to an activation voltage threshold and reset the timer circuit when the gate voltage of the transistor exceeds the activation voltage threshold.

In Aspect 6, the subject matter of one or any combination of Aspects 2-5 optionally includes the transistor of the power switch being one of a silicon carbide field effect transistor (SiC FET), a silicon field effect transistor (Si FET), a gallium nitride field effect transistor (GaN FET), or an insulated gate bipolar transistor (IGBT).

In Aspect 7, the subject matter of one or any combination of Aspects 2-5 optionally includes the transistor of the power switch being a bipolar transistor, and the first comparator circuit is configured to monitor a collector voltage of the bipolar transistor.

In Aspect 8, the subject matter of Aspect 7 optionally includes a fault detection circuit including a second comparator circuit configured to compare a base voltage of the transistor to an activation voltage threshold; and reset the timer circuit when the base voltage of the transistor exceeds the activation voltage threshold.

In Aspect 9, the subject matter of one or any combination of Aspects 2-8 optionally includes a slew rate sensing circuit configured to reset the timer circuit when detecting that the slew rate of the monitored voltage of the transistor is increasing after the detection that the monitored voltage of the transistor is decreasing.

In Aspect 10, the subject matter of one or any combination of Aspects 2-8 optionally includes a slew rate sensing circuit configured to reset the timer circuit when detecting that the monitored voltage of the transistor stops decreasing after the detection that the monitored voltage of the transistor is decreasing.

In Aspect 11, the subject matter of one or any combination of Aspects 1-10 optionally includes a control circuit configured to disable the power switch circuit in response to the indication of the circuit fault.

Aspect 12 can include subject matter (such as a method of monitoring a power switch circuit for a fault condition) or can optionally be combined with one or any combination of Aspects 1-11 to include such subject matter, comprising applying a turn on signal to a transistor of the power switch; comparing a monitored voltage of the transistor to a detection threshold voltage; delaying the comparing for a time delay, wherein the time delay is determined using slew rate of the monitored voltage of the transistor; and indicating a circuit fault according to the comparing of the monitored voltage of the transistor to the detection threshold voltage after the time delay.

In Aspect 13, the subject matter of Aspect 12 optionally includes beginning the time delay from the time of applying the turn on signal to the transistor and resetting the time delay when detecting that the monitored voltage of the transistor is decreasing.

In Aspect 14, the subject matter of Aspect 13 optionally includes resetting the time delay when detecting that the monitored voltage of the transistor is increasing after the decreasing.

In Aspect 15, the subject matter of Aspect 13 optionally includes resetting the time delay when detecting that the monitored voltage of the transistor stops decreasing after the detecting that the monitored voltage of the transistor is decreasing.

In Aspect 16, the subject matter of Aspect 13 optionally includes comparing a drain voltage of the transistor of the power switch to the detection threshold voltage, resetting the time delay when detecting that the drain voltage of the transistor is decreasing, and resetting the time delay when detecting that a gate voltage of the transistor exceeds a gate voltage threshold.

In Aspect 17, the subject matter of Aspect 13 optionally includes comparing a collector voltage of the transistor of the power switch to the detection threshold voltage, resetting the time delay when detecting that the collector voltage of the transistor is decreasing, and resetting the time delay when detecting that a base voltage of the transistor exceeds a gate voltage threshold.

In Aspect 18, the subject matter of one or any combination of Aspects 12-17 optionally includes deactivating the power switch circuit in response to an indication of the circuit fault.

Aspect 19 can include subject matter (such as a switching power converter circuit) or can optionally be combined with one or any combination of Aspects 1-18 to include such subject matter, comprising a power switch circuit and a fault detection circuit. The power circuit is configured to provide energy to an energy storage circuit element of the switching power converter circuit, wherein the power switch circuit includes a power transistor. The fault detection circuit includes a timer circuit configured to time a time delay following activation of the transistor; a first comparator circuit configured to compare a monitored voltage of the transistor to a detection threshold voltage after the activation of the transistor and the time delay, and produce an indication of a circuit fault according to the comparing; and a slew rate sensing circuit configured to reset the timer circuit according to a slew rate of the monitored voltage.

In Aspect 20, the subject matter of Aspect 19 optionally includes the power transistor being a silicon carbide field effect transistor (SiC FET), and the first comparator circuit is configured to monitor a drain voltage of the SiC FET.

In Aspect 21, the subject matter of Aspect 20 optionally includes a slew rate sensing circuit configured to reset the tinier circuit when detecting that the drain voltage of the SiC FET is decreasing.

In Aspect 22, the subject matter of Aspect 21 optionally includes a fault detection circuit including a second comparator circuit configured to compare a gate voltage of the SiC FET to a gate voltage threshold and reset the timer circuit when detecting that the gate voltage of the SiC FET exceeds the gate voltage threshold.

In Aspect 23, the subject matter of Aspect 22, optionally includes a slew rate sensing circuit configured to reset the timer circuit when detecting that the drain voltage of the SiC FET stops decreasing after the detection that the gate voltage of the SiC FET exceeds the gate voltage threshold.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples" or "aspects." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls. In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein," Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by, one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An electronic circuit comprising:
    a power switch circuit including a transistor; and
    a fault detection circuit including:
        a first comparator circuit configured to compare a monitored voltage of the transistor to a detection threshold voltage and produce an indication of a circuit fault according to the comparing; and
        a delay circuit configured to delay the comparing by the first comparator circuit according to slew rate of the monitored voltage.

2. The electronic circuit of claim 1, wherein the delay circuit includes:
    a timer circuit configured to enable a time delay in response to activation of the transistor; and
    a slew rate sensing circuit configured to reset the timer circuit according to the slew rate of the monitored voltage.

3. The electronic circuit of claim 2, wherein the slew rate sensing circuit is configured to reset the timer circuit when detecting that the monitored voltage of the transistor is decreasing.

4. The electronic circuit of claim 2, wherein the first comparator circuit is configured to monitor a drain voltage of the transistor.

5. The electronic circuit of claim 4, wherein the fault detection circuit further includes a second comparator circuit configured to:
    compare a gate voltage of the transistor to an activation voltage threshold; and
    reset the timer circuit when the gate voltage of the transistor exceeds the activation voltage threshold.

6. The electronic circuit of claim 2, wherein the transistor is one of a silicon carbide field effect transistor (SiC FET), a silicon field effect transistor (Si FET), a gallium nitride field effect transistor (GaN FET), or an insulated gate bipolar transistor (IGBT).

7. The electronic circuit of claim 2, wherein the transistor of the power switch circuit is a bipolar transistor, and the first comparator circuit is configured to monitor a collector voltage of the bipolar transistor.

8. The electronic circuit of claim 7, wherein the fault detection circuit further includes a second comparator circuit configured to:
    compare a base voltage of the transistor to an activation voltage threshold; and
    reset the timer circuit when the base voltage of the transistor exceeds the activation voltage threshold.

9. The electronic circuit of claim 2, wherein the slew rate sensing circuit is configured to reset the timer circuit when detecting that the slew rate of the monitored voltage of the transistor is increasing after the detection that the monitored voltage of the transistor is decreasing.

10. The electronic circuit of claim 2, wherein the slew rate sensing circuit is configured to reset the timer circuit when detecting that the monitored voltage of the transistor stops decreasing after the detection that the monitored voltage of the transistor is decreasing.

11. The electronic circuit of claim 1, including a control circuit configured to disable the power switch circuit in response to the indication of the circuit fault.

12. A method of monitoring a power switch circuit for a fault condition, the method comprising:
    applying a turn on signal to a transistor of the power switch;
    comparing a monitored voltage of the transistor to a detection threshold voltage;
    delaying the comparing for a time delay, wherein the time delay is determined using slew rate of the monitored voltage of the transistor; and
    indicating a circuit fault according to the comparing of the monitored voltage of the transistor to the detection threshold voltage after the time delay.

13. The method of claim 12, wherein delaying the comparing includes:
    beginning the time delay from the time of applying the turn on signal to the transistor; and
    resetting the time delay when detecting that the monitored voltage of the transistor is decreasing.

14. The method of claim 13, wherein delaying the comparing includes resetting the time delay when detecting that the monitored voltage of the transistor is increasing after the decreasing.

15. The method of claim 13, wherein delaying the comparing includes resetting the time delay when detecting that the monitored voltage of the transistor stops decreasing after the detecting that the monitored voltage of the transistor is decreasing.

16. The method of claim 13,
    wherein comparing the monitored voltage of the transistor includes comparing a drain voltage of the transistor of the power switch to the detection threshold voltage; and
    wherein resetting timing of the time delay includes:
        resetting the time delay when detecting that the drain voltage of the transistor is decreasing; and
        resetting the time delay when detecting that a gate voltage of the transistor exceeds a gate voltage threshold.

17. The method of claim 13,
    wherein comparing the monitored voltage of the transistor includes comparing a collector voltage of the transistor of the power switch to the detection threshold voltage; and
    wherein resetting the time delay includes:
        resetting the time delay when detecting that the collector voltage of the transistor is decreasing; and resetting the time delay when detecting that a base voltage of the transistor exceeds a gate voltage threshold.

18. The method of claim 12, including deactivating the power switch circuit in response to an indication of the circuit fault.

19. A switching power converter circuit comprising:
a power switch circuit configured to provide energy to an energy storage circuit element of the switching power converter circuit, wherein the power switch circuit includes a power transistor; and
a fault detection circuit including:
 a timer circuit configured to time a time delay following activation of the transistor;
 a first comparator circuit configured to compare a monitored voltage of the transistor to a detection threshold voltage after the activation of the transistor and the time delay, and produce an indication of a circuit fault according to the comparing; and
 a slew rate sensing circuit configured to reset the timer circuit according to a slew rate of the monitored voltage.

20. The switching power converter circuit of claim 19, wherein the power transistor is a silicon carbide field effect transistor (SiC FET), and the first comparator circuit is configured to monitor a drain voltage of the SiC FET.

21. The switching power converter circuit of claim 20, wherein the slew rate sensing circuit is configured to reset the timer circuit when detecting that the drain voltage of the SiC FET is decreasing.

22. The switching power converter circuit of claim 21, wherein the fault detection circuit further includes a second comparator circuit configured to compare a gate voltage of the SiC FET to a gate voltage threshold and reset the timer circuit when detecting that the gate voltage of the SiC FET exceeds the gate voltage threshold.

23. The switching power converter circuit of claim 22, wherein the slew rate sensing circuit is configured to reset the timer circuit when detecting that the drain voltage of the SiC FET stops decreasing after the detection that the gate voltage of the SiC FET exceeds the gate voltage threshold.

* * * * *